(12) United States Patent
Park et al.

(10) Patent No.: US 9,939,699 B2
(45) Date of Patent: Apr. 10, 2018

(54) DISPLAYS WITH BENT SIGNAL LINES

(71) Applicant: Apple Inc., Cupertino, CA (US)

(72) Inventors: Young Bae Park, San Jose, CA (US);
John Z. Zhong, Saratoga, CA (US);
Shih-Chang Chang, Cupertino, CA (US); Wei Chen, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 245 days.

(21) Appl. No.: 14/947,880

(22) Filed: Nov. 20, 2015

(65) Prior Publication Data
US 2016/0085125 A1 Mar. 24, 2016

Related U.S. Application Data

(63) Continuation of application No. 13/591,095, filed on Aug. 21, 2012, now Pat. No. 9,195,108.

(51) Int. Cl.
*G02F 1/133* (2006.01)
*G02F 1/1362* (2006.01)
(Continued)

(52) U.S. Cl.
CPC ...... *G02F 1/136286* (2013.01); *G02F 1/1333* (2013.01); *G02F 1/13306* (2013.01);
(Continued)

(58) Field of Classification Search
CPC .............................................. G02F 1/136286
See application file for complete search history.

(56) References Cited

U.S. PATENT DOCUMENTS 4,066,855 A 1/1978 Zenk
4,085,302 A 4/1978 Zenk et al.
(Continued)

FOREIGN PATENT DOCUMENTS

CN 102148336 A 8/2011
EP 2187443 5/2010
(Continued)

OTHER PUBLICATIONS

Westermand, W. (Spring 1999). "Hand tracking, finger identification, and chordic manipulation on a multi-touch surface," A dissertation submitted to the faculty of the University of Delaware in partial fulfillment of the requirements for the Degree of Doctor of Philosophy in Electrical Engineering, 364 pages.
(Continued)

*Primary Examiner* — Sang V Nguyen
(74) *Attorney, Agent, or Firm* — Treyz Law Group, P.C.; G. Victor Treyz; Kendall W. Abbasi

(57) ABSTRACT

A display may be provided with an active central region and a peripheral inactive region. The display may have one or more flexible edges in the peripheral inactive region. Conductive lines may pass between components in the active central region such as display pixels and touch sensor electrodes and components in the inactive peripheral region such as gate driver circuitry and patterned interconnect lines. Each conductive line may have an unbent segment on a portion of a display layer in the active central region and may have a segment on the bent edge of the display layer. The display layer may be formed from a polymer or other flexible material. The bent segments may be configured to be less susceptible to increases in resistance from bending than the unbent segments.

19 Claims, 15 Drawing Sheets

(51) Int. Cl.
  *G02F 1/1333* (2006.01)
  *H01L 51/52* (2006.01)
  *G02F 1/1345* (2006.01)
  *H01L 27/32* (2006.01)
  *H01L 27/12* (2006.01)
  *H01L 51/00* (2006.01)

(52) U.S. Cl.
  CPC .... *G02F 1/13452* (2013.01); *G02F 1/133305* (2013.01); *H01L 27/124* (2013.01); *H01L 27/1218* (2013.01); *H01L 27/323* (2013.01); *H01L 27/3279* (2013.01); *H01L 27/3297* (2013.01); *H01L 51/52* (2013.01); *H01L 51/5203* (2013.01); *H01L 51/524* (2013.01); *H01L 51/0097* (2013.01); *H01L 2251/5338* (2013.01)

(56) References Cited

U.S. PATENT DOCUMENTS

| | | | |
|---|---|---|---|
| 5,235,451 | A | 8/1993 | Bryan |
| 5,483,261 | A | 1/1996 | Yasutake |
| 5,488,204 | A | 1/1996 | Mead et al. |
| 5,825,352 | A | 10/1998 | Bissel et al. |
| 5,835,079 | A | 11/1998 | Shieh |
| 5,880,411 | A | 3/1999 | Gillespie et al. |
| 6,188,391 | B1 | 2/2001 | Seely et al. |
| 6,310,610 | B1 | 10/2001 | Beaton et al. |
| 6,323,846 | B1 | 11/2001 | Westerman et al. |
| 6,690,387 | B2 | 2/2004 | Zimmerman et al. |
| 6,803,245 | B2 | 10/2004 | Auch et al. |
| 6,956,633 | B2 | 10/2005 | Okada et al. |
| 7,015,894 | B2 | 3/2006 | Morohoshi |
| 7,034,913 | B2 | 4/2006 | Ishida |
| 7,184,064 | B2 | 2/2007 | Zimmerman et al. |
| 7,453,542 | B2 | 11/2008 | Muramatsu et al. |
| 7,541,671 | B2 | 6/2009 | Foust et al. |
| 7,593,086 | B2 | 9/2009 | Jeong et al. |
| 7,593,087 | B2 | 9/2009 | Jang |
| 7,663,607 | B2 | 2/2010 | Hotelling et al. |
| 7,787,917 | B2 | 8/2010 | Aoki et al. |
| 7,834,451 | B2 | 11/2010 | Lee et al. |
| 7,936,405 | B2 | 5/2011 | Kitagawa |
| 8,134,675 | B2 | 3/2012 | Kawaguchi et al. |
| 8,194,048 | B2 | 6/2012 | Oowaki |
| 8,716,932 | B2 | 5/2014 | Rappoport et al. |
| 8,723,824 | B2 | 5/2014 | Myers et al. |
| 8,724,304 | B2 | 5/2014 | Raff et al. |
| 8,787,016 | B2 | 7/2014 | Rothkopf et al. |
| 8,804,347 | B2 | 8/2014 | Martisauskas |
| 8,816,977 | B2 | 8/2014 | Rothkopf et al. |
| 8,929,085 | B2 | 1/2015 | Franklin et al. |
| 8,934,228 | B2 | 1/2015 | Franklin et al. |
| 8,947,627 | B2 | 2/2015 | Rappoport et al. |
| 9,098,242 | B2 | 8/2015 | Rappoport et al. |
| 9,110,320 | B2 | 8/2015 | Chen et al. |
| 2005/0285990 | A1 | 12/2005 | Havelka et al. |
| 2006/0026521 | A1 | 2/2006 | Hotelling et al. |
| 2006/0197753 | A1 | 9/2006 | Hotelling |
| 2007/0148831 | A1 | 6/2007 | Nagata et al. |
| 2008/0117376 | A1 | 5/2008 | Takenaka |
| 2009/0021666 | A1* | 1/2009 | Chen ................ G02F 1/133305 349/58 |
| 2009/0027896 | A1 | 1/2009 | Nishimura et al. |
| 2009/0148678 | A1* | 6/2009 | Hwang ............. H05K 1/0281 428/209 |
| 2009/0167171 | A1 | 7/2009 | Jung et al. |
| 2009/0201635 | A1 | 8/2009 | Kim et al. |
| 2009/0256471 | A1 | 10/2009 | Kim et al. |
| 2009/0284688 | A1 | 11/2009 | Shiraishi et al. |
| 2010/0007817 | A1* | 1/2010 | Kim ................. G02B 6/0083 349/60 |
| 2010/0026952 | A1 | 2/2010 | Miura et al. |
| 2010/0225624 | A1 | 9/2010 | Fu et al. |
| 2010/0315399 | A1 | 12/2010 | Jacobson et al. |
| 2011/0012845 | A1* | 1/2011 | Rothkopf ............. G06F 3/044 345/173 |
| 2011/0069805 | A1* | 3/2011 | Koyama ............. G11C 19/28 377/2 |
| 2011/0086680 | A1 | 4/2011 | Kim et al. |
| 2011/0227487 | A1* | 9/2011 | Nichol ............... G02B 6/0018 315/158 |
| 2011/0227846 | A1 | 9/2011 | Imazeki |
| 2012/0062447 | A1* | 3/2012 | Tseng .............. G02F 1/133305 345/33 |
| 2012/0127087 | A1 | 5/2012 | Ma |
| 2012/0146886 | A1* | 6/2012 | Minami ............. H01L 27/3276 345/80 |
| 2012/0242588 | A1 | 9/2012 | Myers et al. |
| 2012/0243151 | A1 | 9/2012 | Lynch |
| 2013/0021289 | A1 | 1/2013 | Chen et al. |
| 2013/0081756 | A1 | 4/2013 | Franklin et al. |
| 2013/0082984 | A1 | 4/2013 | Drzaic et al. |
| 2013/0140965 | A1 | 6/2013 | Franklin et al. |

FOREIGN PATENT DOCUMENTS

| | | |
|---|---|---|
| JP | 9321083 | 12/1997 |
| JP | 200163031 | 6/2000 |
| JP | 2002342033 | 11/2002 |
| JP | 2010060866 | 3/2010 |
| TW | 200705001 A | 2/2007 |
| TW | 201211959 A1 | 3/2012 |
| WO | 9604682 | 2/1996 |
| WO | 0169577 | 9/2001 |

OTHER PUBLICATIONS

Lee, S.K. et al., (Apr. 1985). "A multi-touch three dimensional touch-sensitive tablet," Proceedings of CHI: ACM Conference on Human Factors in Computing Systems, pp. 21-25.

Rubine, D.H., (Dec. 1991). "The automatic recognition of gestures," CMU-CS-91-202, Submitted in partial fulfillment of the requirements for the degree of doctor of philosophy in computer science at Carnegie Mellon University, 285 pages.

Rubine, D.H. (May 1992). "Combining gestures and direct manipulation," CHI 92, pp. 659-660.

\* cited by examiner

DISPLAYS WITH BENT SIGNAL LINES

This application is a continuation of U.S. patent application Ser. No. 13/591,095, filed on Aug. 21, 2012, which is hereby incorporated by reference herein in its entirety.

BACKGROUND

This relates generally to electronic devices, and more particularly, to electronic devices with displays.

Electronic devices often include displays. For example, cellular telephones and portable computers often include displays for presenting information to a user. An electronic device may have a housing such as a housing formed from plastic or metal. Components for the electronic device such as display components may be mounted in the housing.

It can be challenging to incorporate a display into the housing of an electronic device. Size and weight are often important considerations in designing electronic devices. If care is not taken, displays may be bulky or may be surrounded by overly large borders.

It would therefore be desirable to be able to provide improved displays for electronic devices.

SUMMARY

A display may be provided with an active central region and a peripheral inactive region. The active central region may include planar structures such as color filter layer substrates, thin-film-transistor substrates, and planar touch sensor structures. The peripheral inactive region may be provided with thin-film-transistor gate driver circuitry and other structures.

The display may have one or more flexible edges in the peripheral inactive region. The flexible edges may be bent at an angle with respect to the planar central active portion of the display. Conductive lines may pass between components in the active central region such as display pixels and touch sensor electrodes and components in the inactive peripheral region such as gate driver circuitry and patterned interconnect lines. Each conductive line may include an unbent segment on a portion of a display layer in the active central region and may have a bent segment that traverses the bend on the flexible edge of the display layer.

Display layers may be formed from polymers and other flexible materials. Each bent segment may be configured to be less susceptible to increases in resistance from bending than each unbent segment.

Further features of the invention, its nature and various advantages will be more apparent from the accompanying drawings and the following detailed description of the preferred embodiments.

DETAILED DESCRIPTION

Electronic devices may include displays. The displays may be used to display images to a user. Illustrative electronic devices that may be provided with displays are shown in FIGS. 1, 2, and 3.

Figure 1:
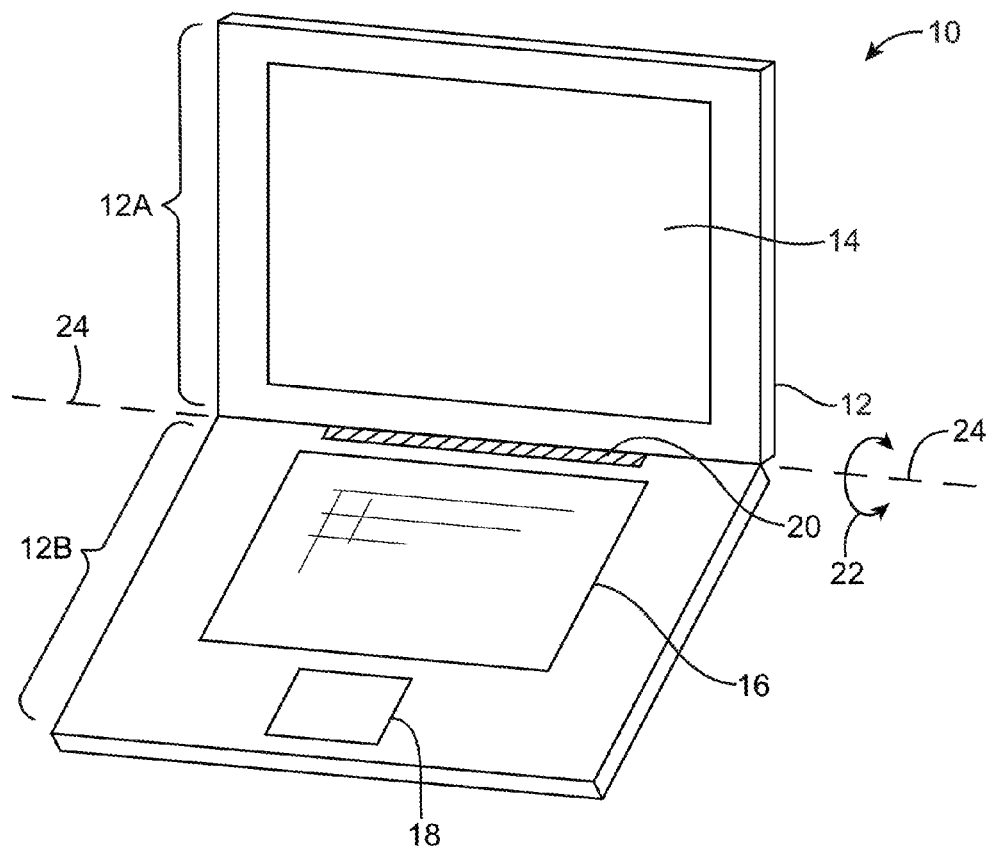
FIG. 1 is a perspective view of an illustrative electronic device such as a laptop computer with a display in accordance with an embodiment of the present invention.

FIG. 1 shows how electronic device 10 may have the shape of a laptop computer having upper housing 12A and lower housing 12B with components such as keyboard 16 and touchpad 18. Device 10 may have hinge structures 20 that allow upper housing 12A to rotate in directions 22 about rotational axis 24 relative to lower housing 12B. Display 14 may be mounted in upper housing 12A. Upper housing 12A, which may sometimes referred to as a display housing or lid, may be placed in a closed position by rotating upper housing 12A towards lower housing 12B about rotational axis 24.

Figure 2:
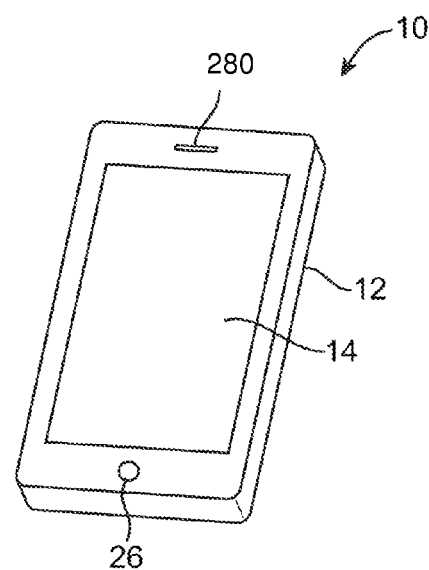
FIG. 2 is a perspective view of an illustrative electronic device such as a handheld electronic device with a display in accordance with an embodiment of the present invention.

FIG. 2 shows how electronic device 10 may be a handheld device such as a cellular telephone, music player, gaming device, navigation unit, or other compact device. In this type of configuration for device 10, housing 12 may have opposing front and rear surfaces. Display 14 may be mounted on a front face of housing 12. Display 14 may, if desired, have a display cover layer or other exterior layer that includes openings for components such as button 26. Openings may also be formed in a display cover layer or other display layer to accommodate a speaker port (see, e.g., speaker port 28 of FIG. 2).

Figure 3:
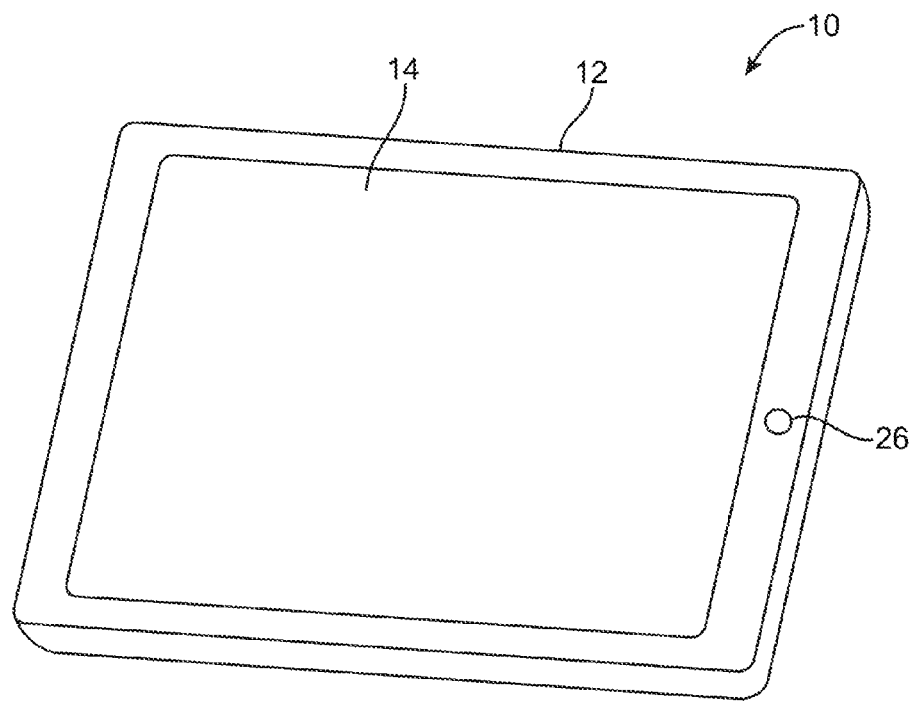
FIG. 3 is a perspective view of an illustrative electronic device such as a tablet computer with a display in accordance with an embodiment of the present invention.

FIG. 3 shows how electronic device 10 may be a tablet computer. In electronic device 10 of FIG. 3, housing 12 may have opposing planar front and rear surfaces. Display 14 may be mounted on the front surface of housing 12. As shown in FIG. 3, display 14 may have a cover layer or other external layer (e.g., a color filter layer or thin-film-transistor layer) with an opening to accommodate button 26 (as an example).

FIG. 2 shows how electronic device 10 may be a handheld device such as a cellular telephone, music player, gaming device, navigation unit, or other compact device. In this type of configuration for device 10, housing 12 may have opposing front and rear surfaces. Display 14 may be mounted on a front face of housing 12. Display 14 may, if desired, have a display cover layer or other exterior layer that includes openings for components such as button 26. Openings may also be formed in a display cover layer or other display layer to accommodate a speaker port (see, e.g., speaker port 280 of FIG. 2).

Housing 12 of device 10, which is sometimes referred to as a case, may be formed of materials such as plastic, glass, ceramics, carbon-fiber composites and other fiber-based composites, metal (e.g., machined aluminum, stainless steel, or other metals), other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Display 14 may be a touch sensitive display that includes a touch sensor or may be insensitive to touch. Touch sensors for display 14 may be formed from an array of capacitive touch sensor electrodes, a resistive touch array, touch sensor structures based on acoustic touch, optical touch, or force-based touch technologies, or other suitable touch sensor components.

Displays for device 10 may, in general, include image pixels formed from light-emitting diodes (LEDs), organic LEDs (OLEDs), plasma cells, electrowetting pixels, electrophoretic pixels, liquid crystal display (LCD) components, or other suitable image pixel structures. In some situations, it may be desirable to use LCD components to form display 14, so configurations for display 14 in which display 14 is a liquid crystal display are sometimes described herein as an example. It may also be desirable to provide displays such as display 14 with backlight structures, so configurations for display 14 that include a backlight unit may sometimes be described herein as an example. Other types of display technology may be used in device 10 if desired. The use of liquid crystal display structures and backlight structures in device 10 is merely illustrative.

A display cover layer may cover the surface of display 14 or a display layer such as a color filter layer, thin-film transistor layer or other portion of a display may be used as the outermost (or nearly outermost) layer in display 14. For example, a color filter layer or thin-film transistor layer that is covered by a polarizer layer may form the outermost layer for device 10. A display cover layer or other outer display layer may be formed from a transparent glass sheet, a clear plastic layer, or other transparent member.

Touch sensor components such as an array of capacitive touch sensor electrodes formed from transparent materials such as indium tin oxide may be formed on the underside of a display cover layer, may be formed on a separate display layer such as a glass or polymer touch sensor substrate, or may be integrated into other display layers (e.g., substrate layers such as a thin-film transistor layer).

Figure 4:
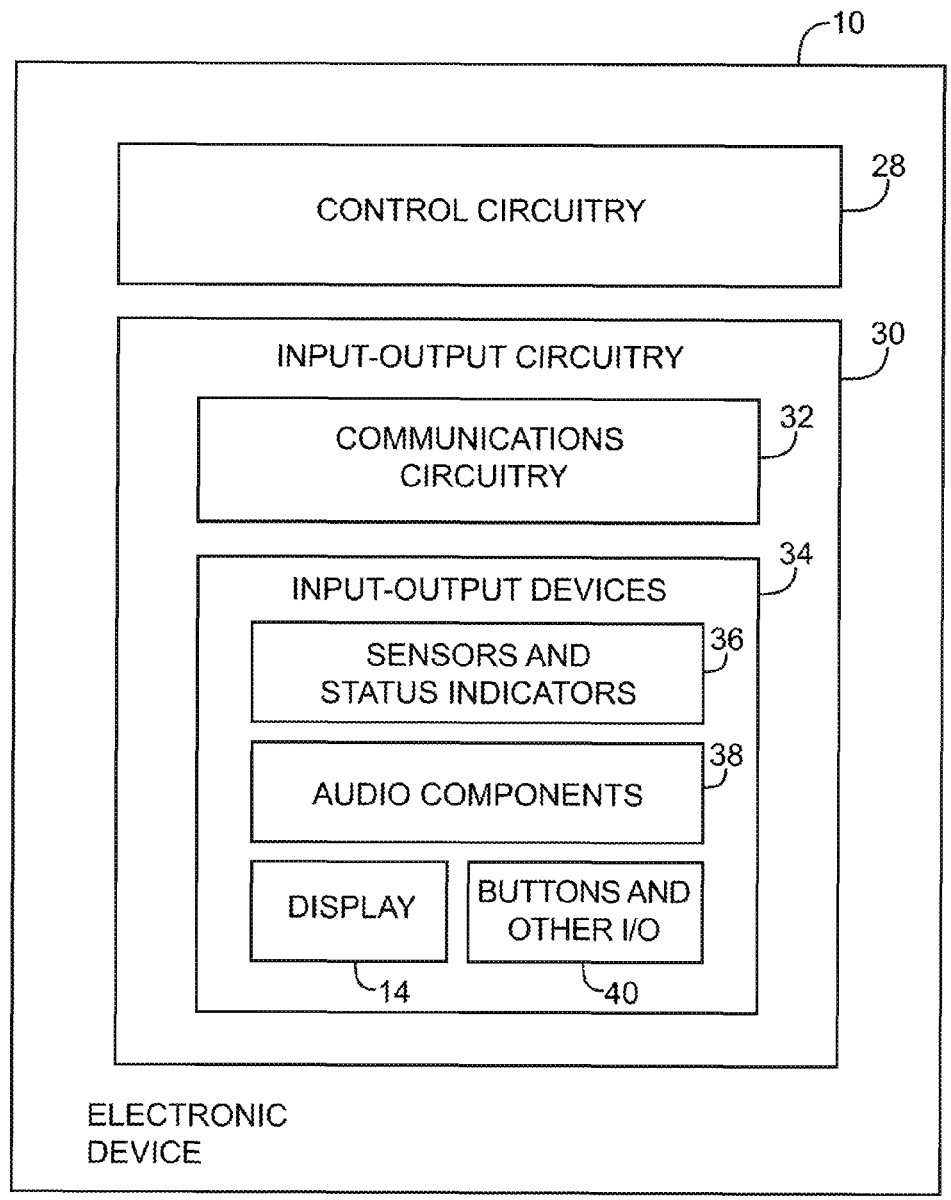
FIG. 4 is a schematic diagram of an illustrative electronic device with a display in accordance with an embodiment of the present invention.

A schematic diagram of an illustrative configuration that may be used for electronic device 10 is shown in FIG. 4. As shown in FIG. 4, electronic device 10 may include control circuitry 28. Control circuitry 28 may include storage and processing circuitry for controlling the operation of device 10. Control circuitry 28 may, for example, include storage such as hard disk drive storage, nonvolatile memory (e.g., flash memory or other electrically-programmable-read-only memory configured to form a solid state drive), volatile memory (e.g., static or dynamic random-access-memory), etc. Control circuitry 28 may include processing circuitry based on one or more microprocessors, microcontrollers, digital signal processors, baseband processors, power management units, audio codec chips, application specific integrated circuits, etc.

Control circuitry 28 may be used to run software on device 10, such as operating system software and application software. Using this software, control circuitry 28 may present information to a user of electronic device 10 on display 14. When presenting information to a user on display 14, sensor signals and other information may be used by control circuitry 28 in making adjustments to the strength of backlight illumination that is used for display 14.

Input-output circuitry 30 may be used to allow data to be supplied to device 10 and to allow data to be provided from device 10 to external devices. Input-output circuitry 30 may include communications circuitry 32. Communications circuitry 32 may include wired communications circuitry for supporting communications using data ports in device 10. Communications circuitry 32 may also include wireless communications circuits (e.g., circuitry for transmitting and receiving wireless radio-frequency signals using antennas).

Input-output circuitry 30 may also include input-output devices 34. A user can control the operation of device 10 by supplying commands through input-output devices 34 and may receive status information and other output from device 10 using the output resources of input-output devices 34.

Input-output devices 34 may include sensors and status indicators 36 such as an ambient light sensor, a proximity sensor, a temperature sensor, a pressure sensor, a magnetic sensor, an accelerometer, and light-emitting diodes and other components for gathering information about the environment in which device 10 is operating and providing information to a user of device 10 about the status of device 10.

Audio components 38 may include speakers and tone generators for presenting sound to a user of device 10 and microphones for gathering user audio input.

Display 14 may be used to present images for a user such as text, video, and still images. Sensors 36 may include a touch sensor array that is formed as one of the layers in display 14.

User input may be gathered using buttons and other input-output components 40 such as touch pad sensors, buttons, joysticks, click wheels, scrolling wheels, touch sensors such as sensors 36 in display 14, key pads, keyboards, vibrators, cameras, and other input-output components.

Figure 5:
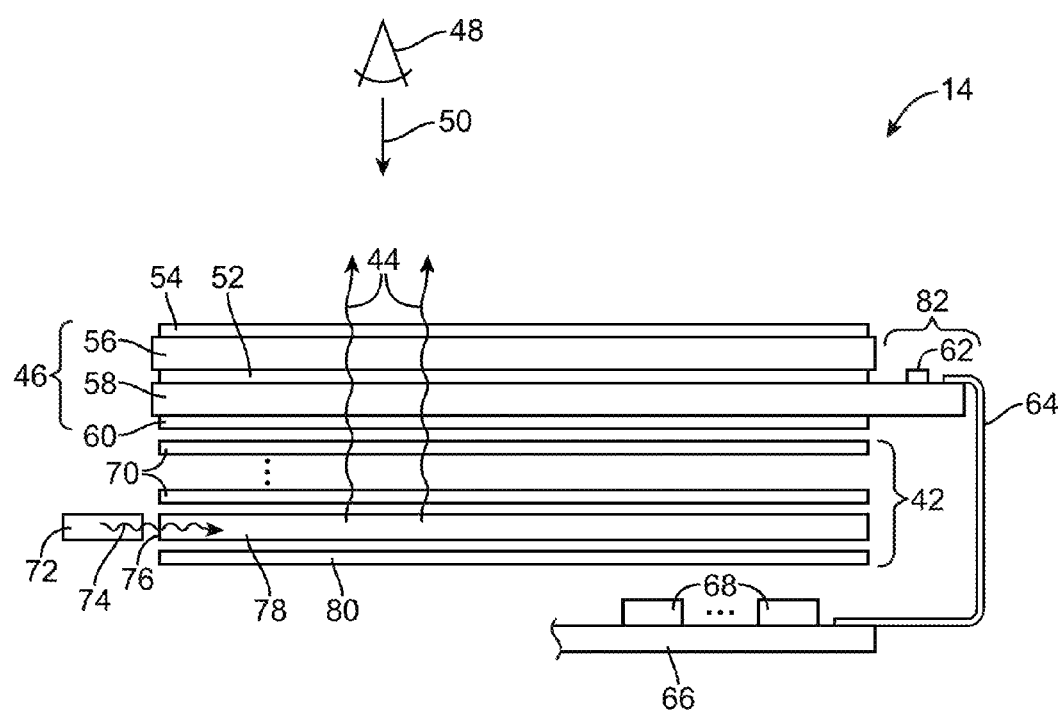
FIG. 5 is a cross-sectional side view of an illustrative display in accordance with an embodiment of the present invention.

A cross-sectional side view of an illustrative configuration that may be used for display 14 of device 10 (e.g., for display 14 of the devices of FIG. 1, FIG. 2, or FIG. 3 or other suitable electronic devices) is shown in FIG. 5. As shown in FIG. 5, display 14 may include backlight structures such as backlight unit 42 for producing backlight 44. During operation, backlight 44 travels outwards (vertically upwards in the orientation of FIG. 5) and passes through display pixel structures in display layers 46. This illuminates any images that are being produced by the display pixels for viewing by a user. For example, backlight 44 may illuminate images on display layers 46 that are being viewed by viewer 48 in direction 50.

Display layers 46 may be mounted in chassis structures such as a plastic chassis structure and/or a metal chassis structure to form a display module for mounting in housing 12 or display layers 46 may be mounted directly in housing 12 (e.g., by stacking display layers 46 into a recessed portion in housing 12). Display layers 46 may form a liquid crystal display or may be used in forming displays of other types.

In a configuration in which display layers 46 are used in forming a liquid crystal display, display layers 46 may include a liquid crystal layer such a liquid crystal layer 52. Liquid crystal layer 52 may be sandwiched between display layers such as display layers 58 and 56. Layers 56 and 58 may be interposed between lower polarizer layer 60 and upper polarizer layer 54.

Layers 58 and 56 may be formed from transparent substrate layers such as clear layers of glass or plastic. Layers 56 and 58 may be layers such as a thin-film transistor layer and/or a color filter layer. Conductive traces, color filter elements, transistors, and other circuits and structures may be formed on the substrates of layers 58 and 56 (e.g., to form a thin-film transistor layer and/or a color filter layer). Touch sensor electrodes may also be incorporated into layers such as layers 58 and 56 and/or touch sensor electrodes may be formed on other substrates in the layers of a display.

With one illustrative configuration, layer 58 may be a thin-film transistor layer that includes an array of thin-film transistors and associated electrodes (display pixel electrodes) for applying electric fields to liquid crystal layer 52 and thereby displaying images on display 14. Layer 56 may be a color filter layer that includes an array of color filter elements for providing display 14 with the ability to display color images. If desired, the positions of color filter layer 56 and thin-film-transistor layer 58 may be inverted so that the thin-film-transistor layer is located above the color filter layer.

During operation of display 14 in device 10, control circuitry 28 (e.g., one or more integrated circuits such as components 68 on printed circuit 66 of FIG. 5) may be used to generate information to be displayed on display (e.g., display data). The information to be displayed may be conveyed from circuitry 68 to display driver integrated circuit 62 using a signal path such as a signal path formed from conductive metal traces in flexible printed circuit 64 (as an example).

Display driver integrated circuit 62 may be mounted on thin-film-transistor layer driver ledge 82 or elsewhere in device 10. A flexible printed circuit cable such as flexible printed circuit 64 may be used in routing signals between printed circuit 66 and thin-film-transistor layer 60. If desired, display driver integrated circuit 62 may be mounted on printed circuit 66 or flexible printed circuit 64. Printed circuit 66 may be formed from a rigid printed circuit board (e.g., a layer of fiberglass-filled epoxy) or a flexible printed circuit (e.g., a flexible sheet of polyimide or other flexible polymer layer).

Backlight structures 42 may include a light guide plate such as light guide plate 78. Light guide plate 78 may be formed from a transparent material such as clear glass or plastic. During operation of backlight structures 42, a light source such as light source 72 may generate light 74. Light source 72 may be, for example, an array of light-emitting diodes.

Light 74 from light source 72 may be coupled into edge surface 76 of light guide plate 78 and may be distributed laterally throughout light guide plate 78 due to the principal of total internal reflection. Light guide plate 78 may include light-scattering features such as pits or bumps. The light-scattering features may be located on an upper surface and/or on an opposing lower surface of light guide plate 78.

Light 74 that scatters upwards from light guide plate 78 may serve as backlight 44 for display 14. Light 74 that scatters downwards may be reflected back in the upwards direction by reflector 80. Reflector 80 may be formed from a reflective material such as a layer of white plastic or other shiny materials.

To enhance backlight performance for backlight structures 42, backlight structures 42 may include optical films 70. Optical films 70 may include diffuser layers for helping to homogenize backlight 44 and thereby reduce hotspots, compensation films for enhancing off-axis viewing, and brightness enhancement films (also sometimes referred to as turning films) for collimating backlight 44. Optical films 70 may overlap the other structures in backlight unit 42 such as light guide plate 78 and reflector 80. For example, if light guide plate 78 has a rectangular footprint when viewed in direction 50 of FIG. 5 (i.e., when viewed as a top view), optical films 70 and reflector 80 may have a matching rectangular footprint.

Display 14 may include a touch sensor (i.e., display 14 may be a touch screen display). The touch sensor may be implemented using an array of capacitive touch sensor electrodes such as transparent conductive electrodes formed from indium tin oxide or may be implemented using other touch technologies (e.g., resistive touch, acoustic touch, light-based touch, etc.). Capacitive touch sensor electrodes and other touch structures may be formed on a clear polymer substrate, a transparent glass substrate, or other substrates. The substrate on which the touch sensor structures are formed may be separate from the layers of display 14 of FIG. 5 (e.g., by forming a touch sensor above upper polarizer 54) or may be combined with one or more of the layers of display 14 of FIG. 5 (e.g., layers such as color filter layer 56 and/or thin-film-transistor layer 58).

To form narrow borders for display 14, it may be desirable to bend display layers along the edges of display 14. For example, it may be desirable to bend a flexible portion of a substrate so that inactive display structures such as the structures associated with gate driver circuitry in a liquid crystal display or the structures associated with distributing and gathering signals from capacitive touch sensor electrodes in a touch sensor are bent out of the way and are not visible to a viewer of display 14. As an example, it may be desirable to bend flexible tail portions of a liquid crystal display or inactive edge portions of an organic light-emitting diode display downwards at a right angle with respect to a planar active display region. It may also be desirable to bend flexible inactive edge portions of a flexible touch sensor downwards at right angles to the active portion of the touch sensor.

When bending flexible substrates in a display, care should be taken to avoid creating stress cracks in the conductive lines on the substrates. Conductive lines that are formed exclusively from thin layers of relatively stiff metals such as aluminum may be prone to cracking if bent excessively.

The layers of a display with bent edges may be formed from flexible planar sheets of material with bent edges or from rigid structures that have flexible edge portions that are bent.

Figure 6:
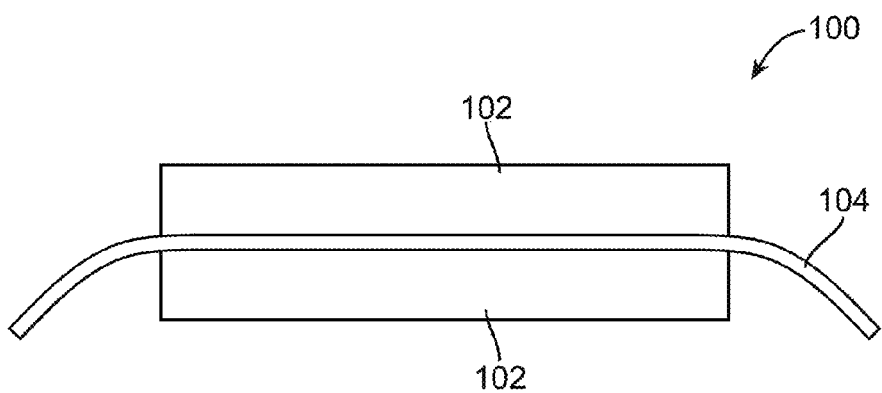
FIG. 6 is a cross-sectional side view of an illustrative structure such as a display or touch sensor having a rigid central area and flexible edge portions in accordance with an embodiment of the present invention.

FIG. 6 is a cross-sectional side view of display structures for display 14 in a configuration in which the display structures have a rigid central region formed by rigid substrates 102 and a flexible edge portion formed by laterally protruding flexible display layers 104. Display layers 104 may include structures such as thin flexible sheets of polymer, liquid crystal material, indium tin oxide touch sensor structures, or other flexible structures. Substrates 102 may be formed from layers of glass, plastic, or other materials that are generally harder and more rigid than flexible display layers 104.

In the portion of display structures 100 in which flexible display layers 104 are sandwiched between substrate layers 102, display structures 100 will be relatively rigid. In edge portions running along one or more, two or more, three or more, or four or more of the edges of display structures 100, portions of flexible display layers 104 that are uncovered by rigid substrate layers 102 may be flexible to allow these edge portions of layers 104 to be bent at an angle with respect to the planar rigid portion of structures 100 that is formed by substrate layers 102.

Figure 7:
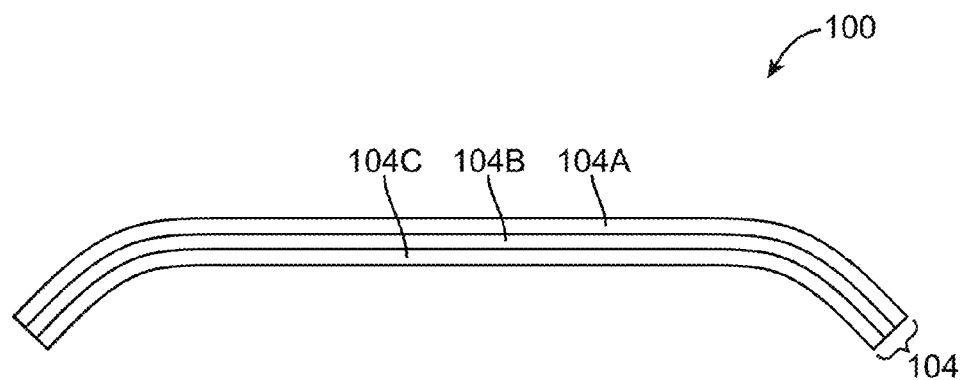
FIG. 7 is a cross-sectional side view of an illustrative flexible structure such as a flexible display or flexible touch sensor having bent edge portions in accordance with an embodiment of the present invention.

As shown in FIG. 7, display structures 100 may include a flexible layer with bent edges such as flexible display layer 104 in a configuration in which no rigid substrate layers are present.

Flexible display layers 104 of FIG. 6 and FIG. 7 may be touch sensor layers and/or display layers that include active display pixels for presenting images to a user (e.g., a flexible organic light-emitting diode layer). As shown in FIG. 7, flexible display layer 104 may, if desired, include one or more sublayers of material such as sublayers 104A, 104B, and 104C. Sublayers 104A, 104B, and 104C may include emissive organic layers, encapsulation layers, substrate layers, touch sensor electrode layers, thin-film-transistor layer substrates or other display pixel substrates, or other touch and display structure layers.

Display 14 may have a rectangular shape with a periphery having four edges. The flexible edge portions of display structures 100 in configurations of the type shown in FIGS. 6 and 7 may be bent along one or more of the four peripheral edges, along two or more of the four peripheral edges, along three or more of the four peripheral edges, or along four or more of the four peripheral edges. The bent edges may be formed by bending flexible structures such as protruding flexible layer 104 of FIG. 6 and the edges of flexible layer 104 of FIG. 7 along a fold line (sometimes referred to as a bend axis). A minimum bend radius R may be maintained during bending to prevent damage to the display structures. The value of bend radius R may be, for example, less than 2 mm, less than 1 mm, less than 0.5 mm, or less than 0.25 mm (as examples).

Figure 8:
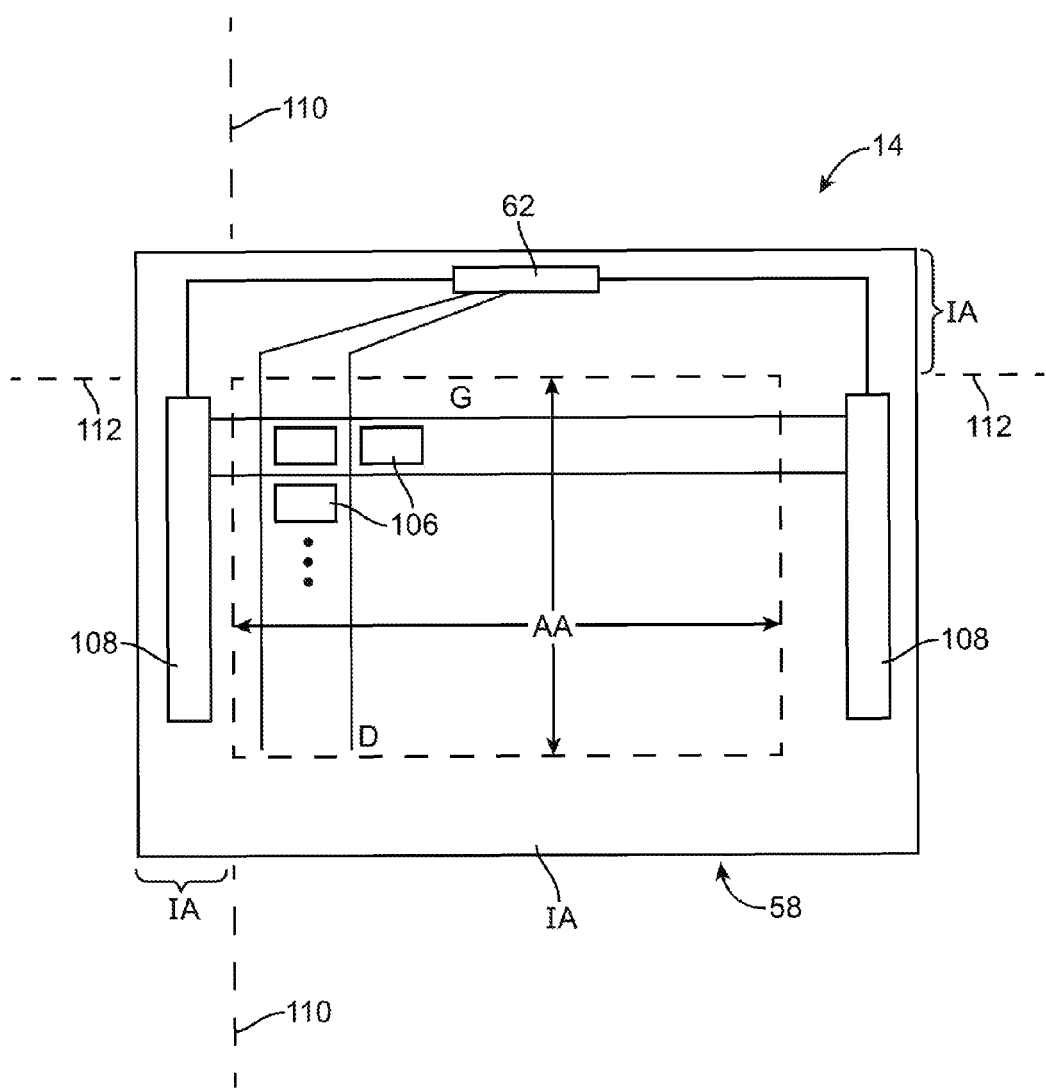
FIG. 8 is a top view of an illustrative display in accordance with an embodiment of the present invention.

FIG. 8 is a top view of an illustrative display of the type having edge structures that may be folded out of the way to minimize the display border. The structures of FIG. 8 may be, for example, display structures that include pixels for producing images for a viewer. As shown in FIG. 8, display 14 may include a substrate such as thin-film-transistor layer 58. A display driver integrated circuit may be mounted on thin-film-transistor layer 58 or may be mounted on a separate substrate such as a flexible printed circuit that is attached to layer 58. Display 14 may include a central rectangular active area AA containing rows and columns of display pixels 106 (e.g., an array of display pixels). Each display pixel may contain electrodes for applying an electric field to an associated portion of liquid crystal layer 52 and a thin-film transistor for controlling the electric field.

Data pixels 106 may be controlled by signals that are applied to data pixels 106 via signal lines such as data lines D and gate lines G. Gate driver circuitry 108 may be used to assert gate control signals on gate lines G. Gate driver circuitry 108 may include thin-film transistors. Thin-film transistor gate driver circuitry 108 and the thin-film transistors of display pixels 106 may be formed from thin-film semiconductor materials such as silicon (e.g., polysilicon or amorphous silicon) or compound semiconductors (e.g., indium gallium zinc oxide).

The rectangular array of display pixels 106 in display 14 is used in displaying images for a user and is therefore sometimes referred to as the active area (area AA) of display 14. Inactive region IA may surround active area AA on thin-film-transistor layer 58. Inactive region IA may form a rectangular ring that surrounds the periphery of active area AA (as an example). Circuitry such as gate driver circuitry 108 and associated conductive paths (metal lines) may be formed in inactive regions. To minimize the visibility of the inactive border regions of display 14, display 14 may be provided with flexible edges (e.g., by forming the circuitry of FIG. 8 on a flexible display layer such as layer 104 of FIGS. 6 and 7). With this type of arrangement, inactive display regions IA may be bent out of the way by folding the flexible display layer along bend lines in the inactive regions such as illustrative bend lines 110 and 112 of FIG. 8.

When forming folds in the layers of display 14 in this way, care should be taken not to damage the conductive paths on the display such as the data lines D and gate lines G and the other conductive lines that are used in routing signals for display 14. The process of bending a flexible layer in a display such as a display layer with display pixels or a flexible touch sensor layer may bend conductive paths on the flexile layer sufficiently to create stress cracks in metal lines in the bent area. Premature failures, increased line resistance, and other issues with metal that has stress cracks can be avoided by providing the flexible layers of display 14 with structures that are configure to resist damage during bending and to be less susceptible to increases in resistance from bending than unbent structures.

Figure 9:
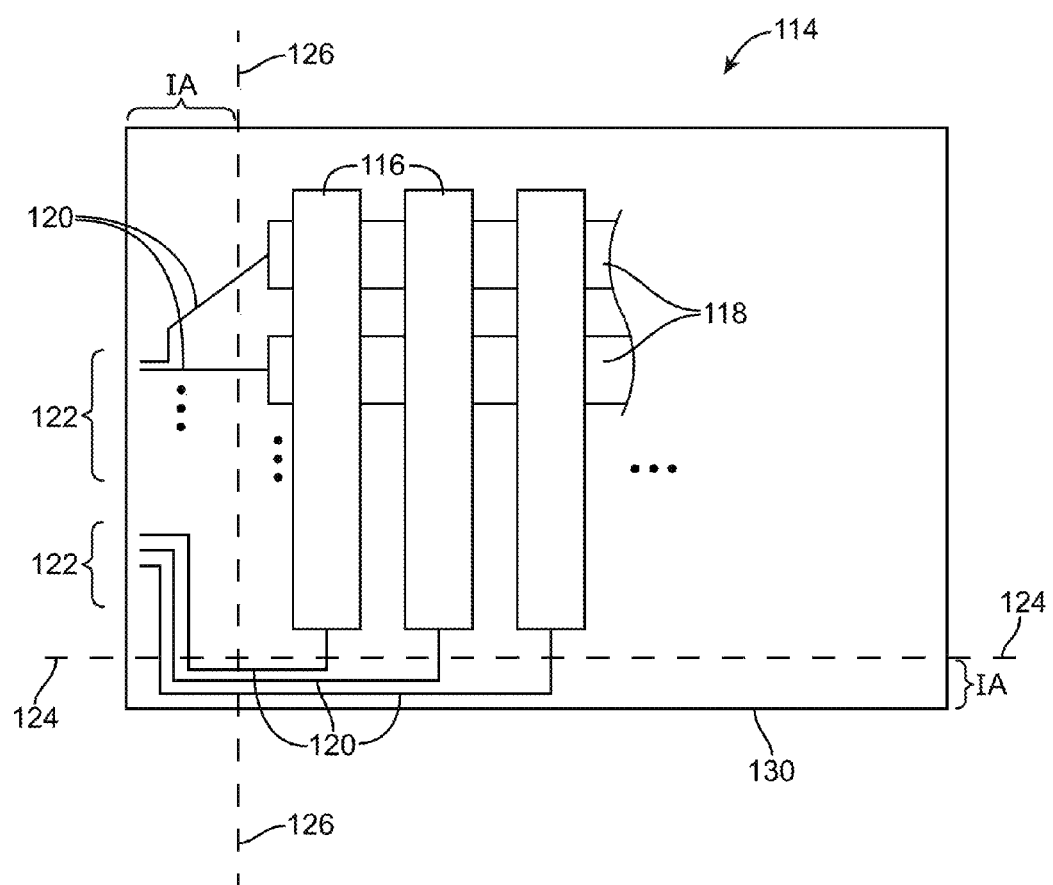
FIG. 9 is a top view of an illustrative touch sensor in accordance with an embodiment of the present invention.

FIG. 9 is a top view of an illustrative touch sensor. Touch sensor 114 may be formed on a flexible substrate such as substrate 130. Substrate 130 may be formed from a layer of polyimide or a sheet of other flexible polymeric material. Substrate 130 may be integrated with display pixels and other active area display circuitry (e.g., substrate 130 may be integrated with a color filter layer, thin-film transistor layer, or other liquid crystal display substrate layer) or may be formed form a separate substrate that is mounted on top of a color filter layer other display layer.

Capacitive touch sensor electrodes such as electrodes 116 and 118 may be formed on substrate 130. Electrodes 116 and 118 may be formed on the same side of substrate 130 and may be separated by an interposed dielectric layer or may be formed on opposing sides of substrate 130 (as examples). Configurations for sensor 114 that use electrodes of other shapes and sizes (e.g., square pads, thin columns or rows of electrodes), or other capacitive electrode structures may be used if desired. The illustrative configuration of FIG. 9 is merely illustrative.

Capacitive touch sensor electrodes 116 and 118 may be formed from transparent conductive materials such as indium tin oxide. Conductive lines 120 may be used to connect electrodes 116 and 118 to connection areas 122. A flexible printed circuit cable may be used to couple touch sensor 114 to touch sensor processing circuitry. The conductive traces in the flexible printed circuit cable may be connected to conductive lines 120 using conductive adhesive (e.g., anisotropic conductive film), solder, welds, connectors, or other connecting structures.

The conductive paths of the thin-film transistor circuitry such as lines D and G and the lines interconnecting display driver integrated circuit 62 and gate driver circuitry 108 with display pixels in FIG. 8 and the conductive paths of display layers such as touch sensor layer 114 of FIG. 9 may be formed from conductive materials such as one or more layers of metal.

In displays such as liquid crystal displays in which the thin-film-transistor circuitry is formed from silicon, conductive lines such as lines D and G and the other conductive lines on thin-film-transistor substrate 58 may, as an example, be formed from materials such as aluminum (e.g., solid aluminum or a multi-layer stack formed from a layer of aluminum sandwiched between layers of a metal such as molybdenum). In displays such as liquid crystal displays in which the thin-film-transistor circuitry is formed from a compound semiconductor, the conductive structures such as lines D and G and the other conductive lines on thin-film-transistor substrate 58 may be formed from a metal such as copper (as an example). In touch sensors, conductive lines may be formed from aluminum, copper, or other metals.

Copper lines or lines formed from other relatively soft and flexible metals may be sufficiently flexible to withstand damage during bending. Displays that have copper lines (e.g., for forming data and gate lines in the active area of the display) may therefore use copper lines in the bent inactive edge portions of the display. These lines may be, for example, integrally formed extended portions of the data lines or other lines in the active area of the display. Aluminum tends to be more susceptible to stress cracking than copper, so in displays with aluminum lines it may be desirable to use different materials and/or structures in the bent regions from the aluminum line structures being used in the active area. In this way, the conductive paths in the inactive region may be configured to resist cracking. As an example, the bent portions of the conductive paths may be provided with a segment of a soft metal such as copper or may be formed using other materials and/or structures that enhance the ability of the lines to flex without damage and without exhibiting undesired increase in resistance).

Figure 10:
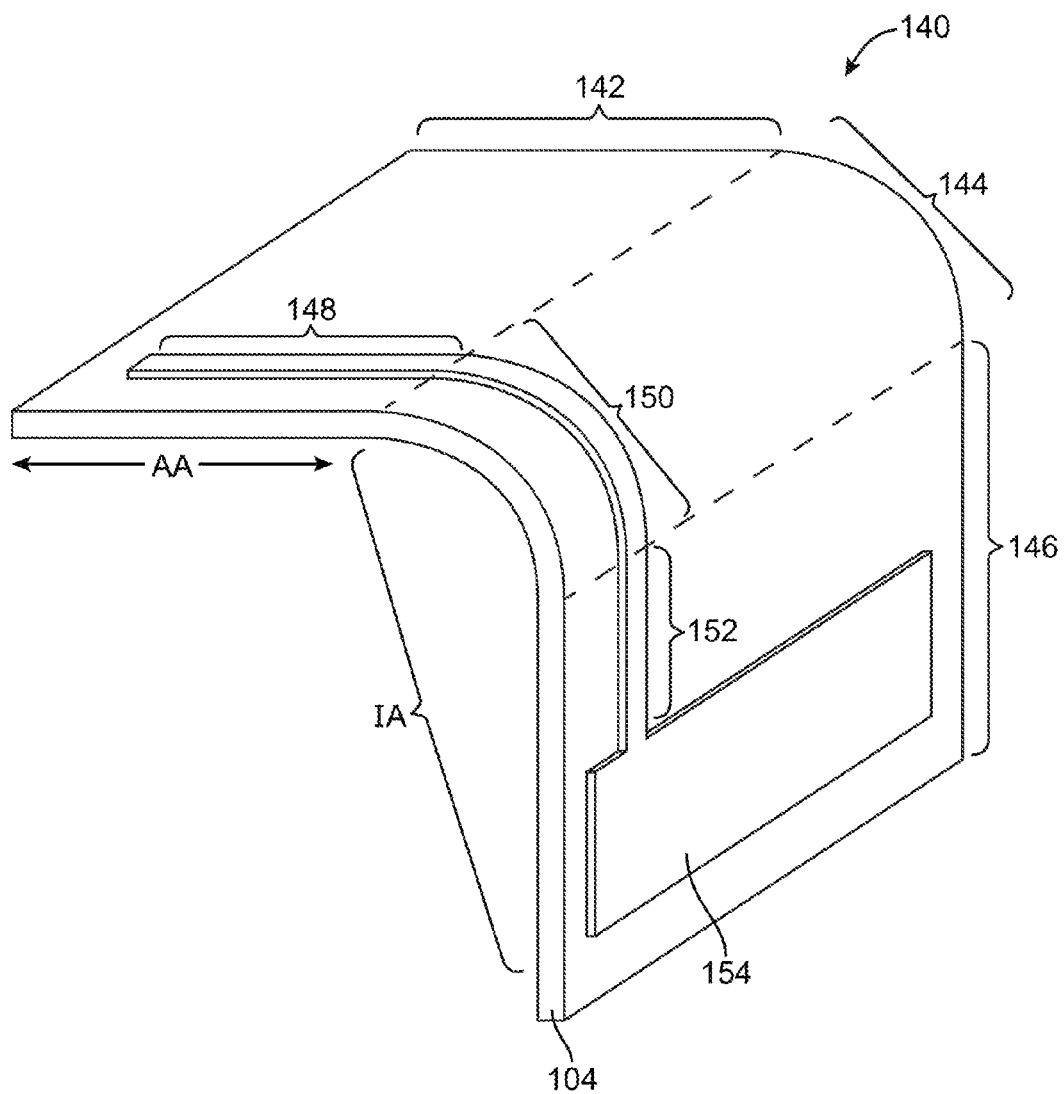
FIG. 10 is a perspective view of an illustrative structure such as a display pixel substrate or touch sensor structure that has a bent edge portion with a signal path that is formed as an integral extension of a conductive line on unbent portions of the structure in accordance with an embodiment of the present invention.

FIG. 10 is a perspective view of display structures with a bent edge portion. Display structures 140 of FIG. 10 may include one or more layers that include an array of display pixels for producing images for a user and/or one or more touch sensor layers. Display structures 140 may have flexible bent edge portions 144 in inactive area IA. Inactive area IA may also include portions such as portions 146 on which components 154 are formed. Components 154 may include, for example, thin-film-transistor gate driver circuitry, circuitry associated with thin-film-transistor signal demultiplexing circuits, circuitry for routing and otherwise processing touch sensor signals, an integrated circuit such as display driver integrated circuit 62, or other display circuits associated with displaying images and/or processing touch sensor signals. Display structures 140 may be formed using a rigid central region with flexible tails of the type described in connection with FIG. 6 or may be formed using a flexible layer as described in connection with FIG. 7 (as examples).

Portion 146 of display structures 140 may, if desired, have a planar shape and may contain conductive lines such as lines 152.

With a configuration of the type shown in FIG. 10, active area conductive lines 148 (e.g., unbent lines that lie in a planar active portion of the display), conductive lines 150 that traverse bend 144 (e.g., bent lines), and conductive lines 152 (e.g., unbent lines or lines that are bent less than line segments 150) may all be formed as integral portions of the same patterned conductive lines on the same layer of material. As an example, in a compound semiconductor thin-film-transistor display structure or a touch sensor, line segments such as segments 148, 150, and 152 may each form a portion of a unitary copper line.

Figure 11:
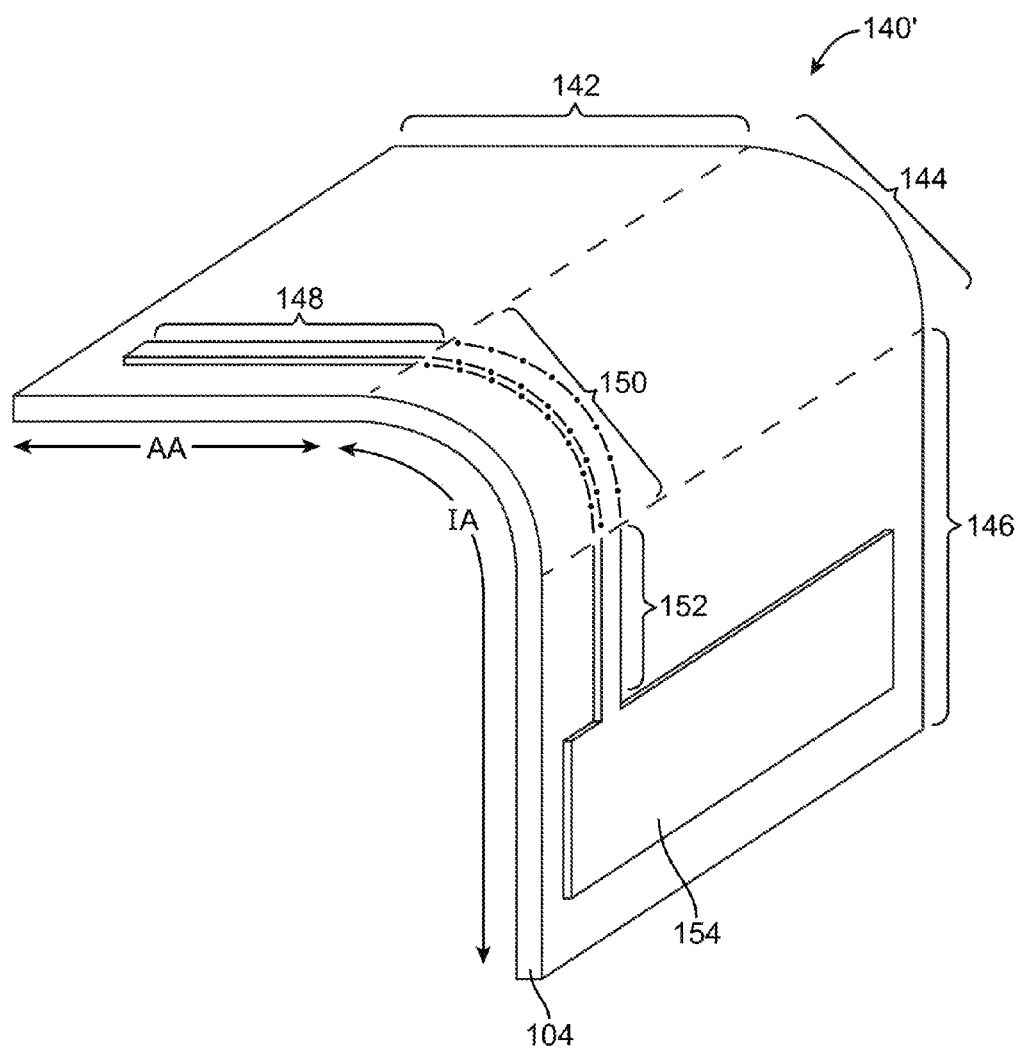
FIG. 11 is a perspective view of an illustrative structure such as a display pixel substrate or touch sensor structure that has a conductive path with an unbent segment and a bent segment that is less susceptible to increases in resistance from bending than the unbent segment in accordance with an embodiment of the present invention.

As shown by illustrative display structures 140' of FIG. 11, line segments such as line segment 150 in bent region 144 of inactive area IA may, if desired, be fully or partly formed from structures that are different than the structures used in forming line segments 148 and 152. In particular, line segment 150 may be formed from materials such as copper that are more flexible and less prone to resistance increases upon bending than the materials of segments 148 and 152 and/or may be formed from structures such as parallel lines, mesh structures, structures using supplemental layers of bendable conductor, meandering line structures, structures with undulating surfaces, or other structures that allow segment 150 to be more flexible and more resistant to damage and resistance increases when bent than unbent segments 148 and 152. Configurations of the type shown in FIG. 11 may be used where it is desired to form segments such as segment 148 (and, if desired, segments such as segment 152) from materials such as aluminum that can be prone to stress-induced cracking for compatibility with other display fabrication operations).

Figure 12:
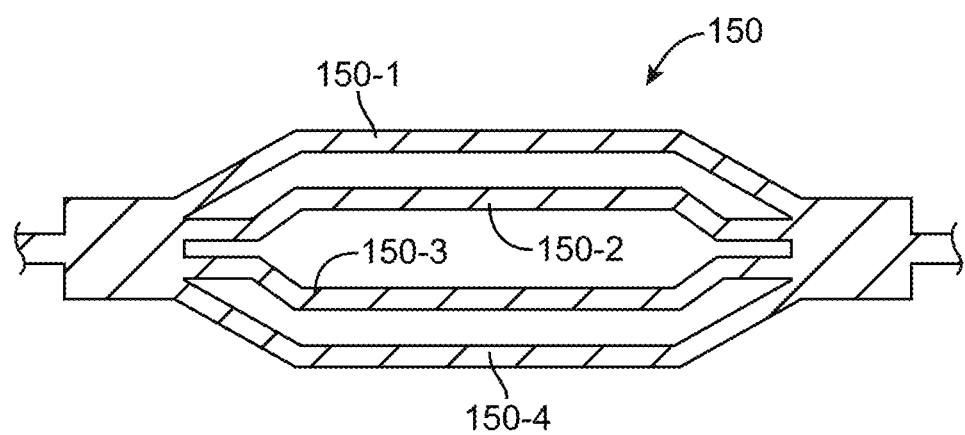
FIG. 12 is a perspective view of an illustrative structure such as a display pixel substrate or touch sensor structure that has a signal path on a bent surface that is formed from parallel conductive lines in accordance with an embodiment of the present invention.

FIG. 12 is a top view of an illustrative structure that may be used for forming segment 150. In the illustrative configuration of FIG. 12, conductive signal path segment 150 has been formed from a conductive line that has been divided into multiple parallel lines 150-1, 150-2, 150-3, and 150-4. Due to the presence of multiple redundant parallel signal paths, line segment arrangements of the type shown in FIG. 12 are less likely to fail due to stress cracks (which, when present, tend to propagate across the entire width of a given line). There are four parallel line segments in the illustrative configuration of FIG. 12, but, in general, line segment 150 may be provided with any suitable number of parallel lines (e.g., two or more, three or more, four or more, 10 or more, etc.).

Figure 13:
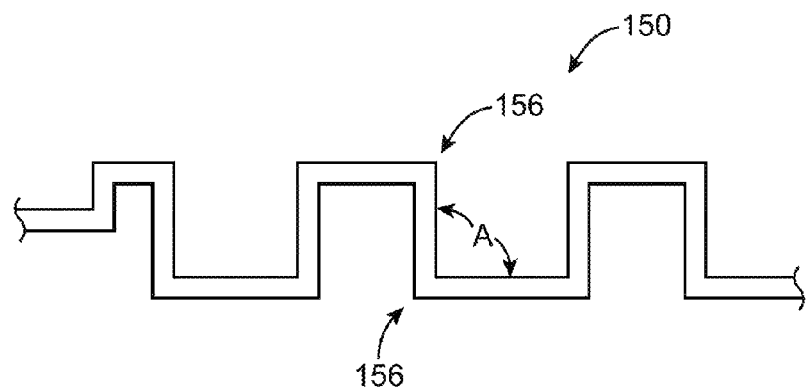
FIG. 13 is a top view of an illustrative structure such as a display pixel substrate or touch sensor structure that has a signal path on a bent surface that is formed from a meandering line with right angle bends in accordance with an embodiment of the present invention.
Figure 14:
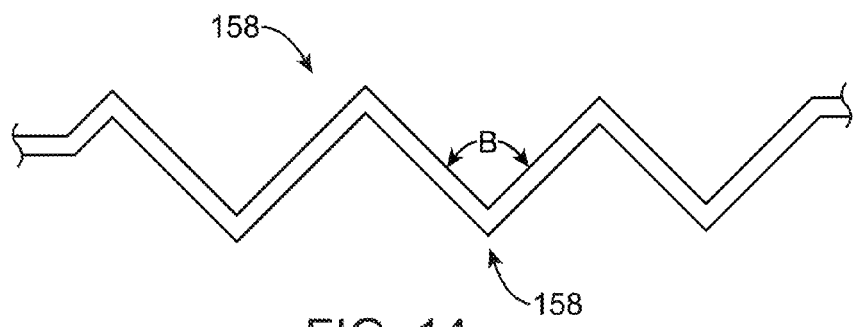
FIG. 14 is a top view of an illustrative structure such as a display pixel substrate or touch sensor structure that has a signal path on a bent surface that is formed from a meandering line with angled bends in accordance with an embodiment of the present invention.

In the illustrative configuration of line segment 150 of FIG. 13, line segment 150 has a meandering path. The use of the meandering path allows line segment 150 to stretch slightly when bent due the presence of the bend of region 144. The illustrative meandering path of FIG. 13 has bends such as bends 156 at angles A of 90°. FIG. 14 shows an illustrative meandering path configuration for segment 150 that has bends 158 at angles B of about 30-150°. Other types of meandering path shapes may be used if desired (e.g., paths with curved shapes, paths with combinations of curved and straight segments, etc.).

Figure 15:
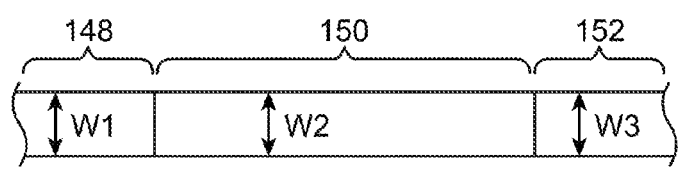
FIG. 15 is a top view of an illustrative structure such as a display pixel substrate or touch sensor structure that has a signal path on a bent surface that is formed from a flexible conductive material in accordance with an embodiment of the present invention.
Figure 16:
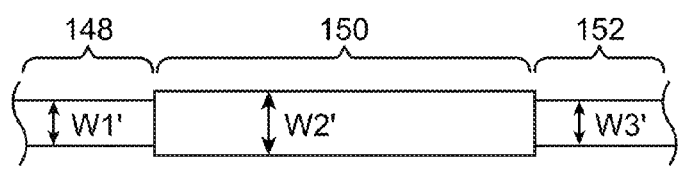
FIG. 16 is a top view of an illustrative structure such as a display pixel substrate or touch sensor structure that has a signal path on a bent surface that is formed from a locally widened conductive line in accordance with an embodiment of the present invention.

FIG. 15 shows how segment 150 may be formed from a more flexible conductive material than the materials used in segments 148 and 152. For example, segments 148 and 152 may be formed from aluminum (with or without thin upper and lower layers of molybdenum) and segments 150 may be fully or partly formed from copper, which is softer and more resistant to cracking when bent than aluminum. The respective widths W1, W2, and W3 of lines 148, 150, and 152 may, if desired, be substantially equal. FIG. 16 shows how the respective widths W1', W2', and W3' of line segments 148, 150, and 152 may, if desired, be configured so that the conductive line is locally widened in the portion where the line is bent (i.e., W2' may be greater than W1' and/or W3'). The material used to form widened segment portion 150 may be formed from the same material as segments 148 and 152 or may be formed from a different material (e.g., a softer more flexible material such as copper).

Figure 17:
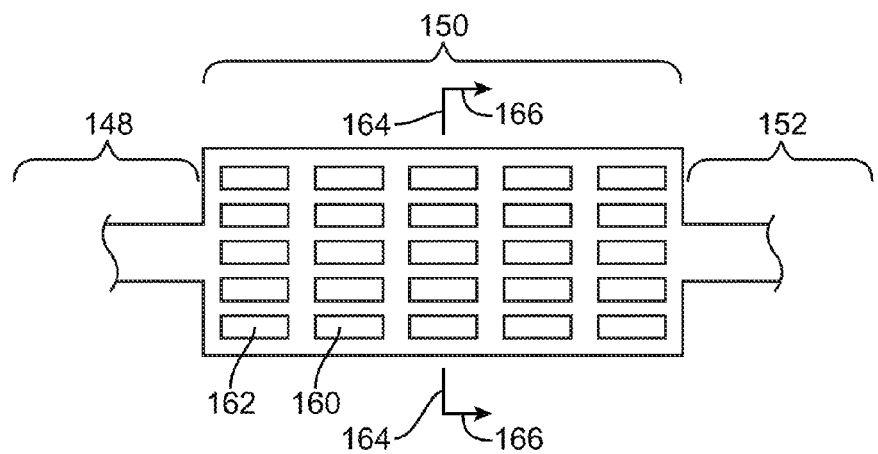
FIG. 17 is a top view of an illustrative structure such as a display pixel substrate or touch sensor structure that has a signal path on a bent surface that is formed from a conductive mesh in accordance with an embodiment of the present invention.

If desired, line segments such as line segment 150 may be formed from conductive mesh structures. This type of arrangement is shown in FIG. 17. As shown in FIG. 17, line segments 148 and 152 may be formed from solid lines. Line segment portion 150 may be formed from a mesh having a conductive grid layout with an array of openings (e.g., conductive metal grid 162 with openings 160).

Figure 18:
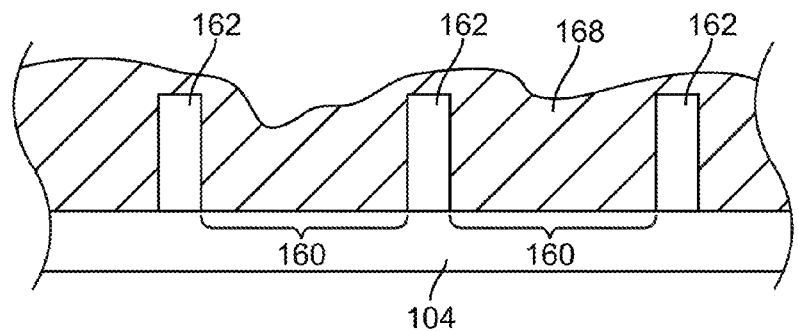
FIG. 18 is a cross-sectional side view of an illustrative structure such as a display pixel substrate or touch sensor structure that has a signal path on a bent surface that is formed from a conductive mesh with a conductive paint or other material with conductive particles in accordance with an embodiment of the present invention.

If desired, a material containing conductive particles such as silver paint or other metal paint, conductive paint filled with conductive nanostructures, a conductive material containing conductive fibers such as carbon nanofibers or metal nanofibers, or other bendable conductive material may be used in coating mesh 162. FIG. 18 is a cross-sectional view of line segment 150 taken along line 164 and viewed in direction 166 in a configuration in which grid 162 has been filled with a material containing conductive particles such as conductive paint 168. As shown in FIG. 18, conductive material 168 may fill some or all of openings 160 in the mesh 162.

Figure 19:
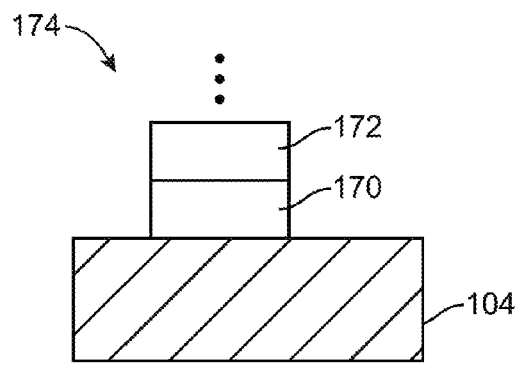
FIG. 19 is a cross-sectional end view of an illustrative structure such as a display pixel substrate or touch sensor structure that has a signal path on a bent surface that is formed from multiple conductive layers in accordance with an embodiment of the present invention.

As shown in the cross-sectional side view of FIG. 19, conductive lines such as line 174 may be formed form one or more layers of conductive material (e.g., metal or other material in layers such as layers 170, 172, etc.). Conductive lines such as line 174 may be used in forming line segments such as segments 148, 150, and/or 152. If desired, conductive display lines may be formed from aluminum (or aluminum sandwiched between upper and lower layers of molybdenum) in segments 148 and 152 while in segment 150, one or more layers of flexible metal (e.g., an upper layer such as layer 172) may be formed on top of the aluminum (or aluminum sandwiched between upper and lower layers of molybdenum). In this type of configuration, the presence of a softer more flexible upper layer such as layer 172 on a less flexible layer such as layer 170 may help the conductive line withstand damage and increases in resistance in bent segment 150.

Figure 20:
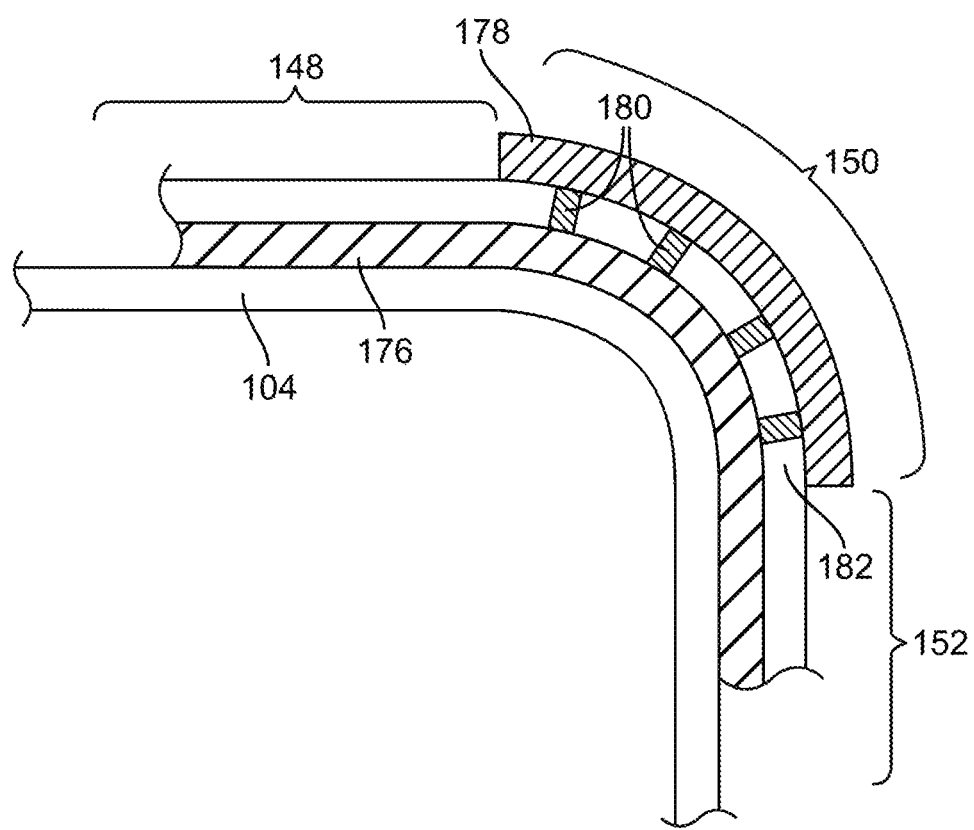
FIG. 20 is a cross-sectional side view of an illustrative structure such as a display pixel substrate or touch sensor structure that has a signal path on a bent surface that is formed from a lower conductive line and an upper conductive line that is coupled to the lower conductive line by vias through an interposed dielectric layer in accordance with an embodiment of the present invention.

If desired, one or more additional layers of metal may be added to bent segment 150 by using vias that pass through a dielectric layer to couple one or more upper layers of conductive material to a conductive line. This type of configuration for line segment 150 is shown in FIG. 20. As shown in FIG. 20, a conductive display line may have segments such as segments 148 and 152 that are coupled by bent line segment 150. Line segments 148, 150, and 152 may include a conductive line such as conductive line 174 on display layers 104 (e.g., on a dielectric substrate with a flexible edge region that is bent). Line 174 may be formed from metal. For example, line 174 may be formed from aluminum or copper. A dielectric layer such as passivation layer 182 (e.g., one or more inorganic layers of material such as silicon oxide or silicon nitride) may be used to cover structures such as line 174.

To provide line segment 150 with an enhanced ability to resist damage when bent as shown in FIG. 20, a line segment such as line segment 178 may be formed on top of line 174. Line segment 178 may be formed form a material such as copper or other flexible metal (as an example). Vias 180 (e.g., through holes in dielectric layer 182 that have been filled with a conductive material such as metal) may be used to electrically connect metal line segment 178 to metal lines 174 within bent line segment 150. In the illustrative configuration of FIG. 20, one additional layer of conductive material has been added to line 174 in forming line segment 150. This is merely illustrative. If desired, two or more additional line layers may be added to line 174 to form bent line segment 150.

Figure 21:
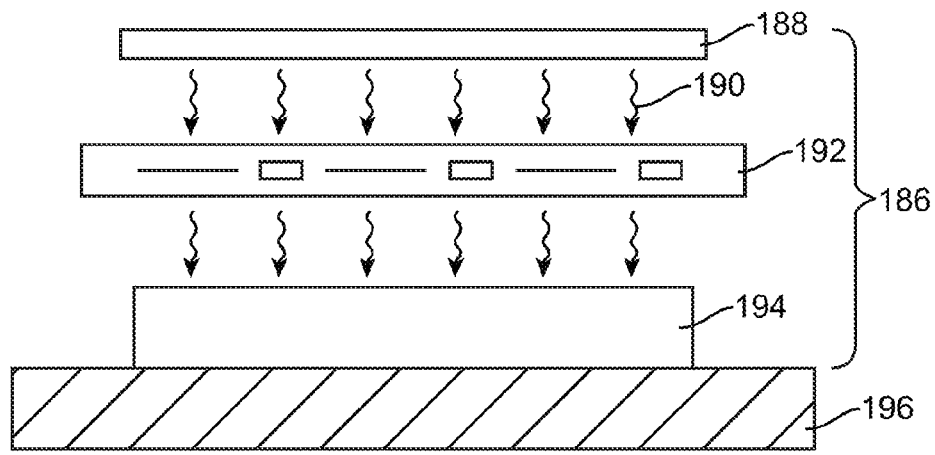
FIG. 21 is a side view of half-tone mask equipment being used to expose a photoimageable polymer layer in accordance with an embodiment of the present invention.
Figure 22:
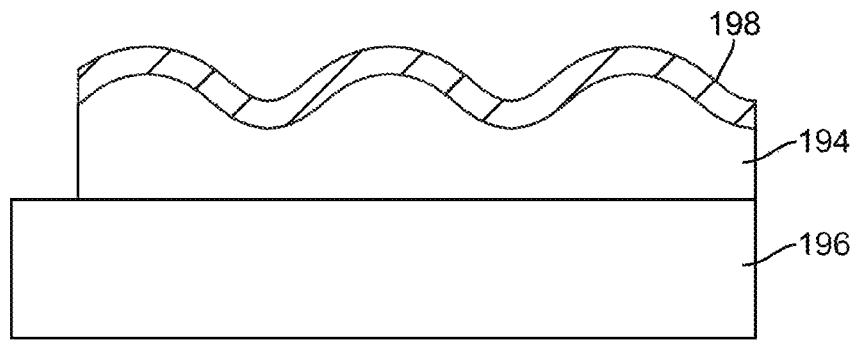
FIG. 22 is a cross-sectional side view of a conductive line with an undulating surface of the type that may be produced using the equipment of FIG. 21 in accordance with an embodiment of the present invention.

FIG. 21 is a diagram of a system that may be used to form a corrugated line that is resistant to damage when bent. Light source 188 may produce line 190. Light 190 may be passed through half-tone photomask 192 before exposing photoimageable polymer 194 on substrate 196. Following development of photoimageable polymer 194 to produce a corrugated dielectric substrate, a deposition tool and photolithographic equipment may be used to deposit and pattern a conductive line such as metal line 198 of FIG. 22.

Figure 23:
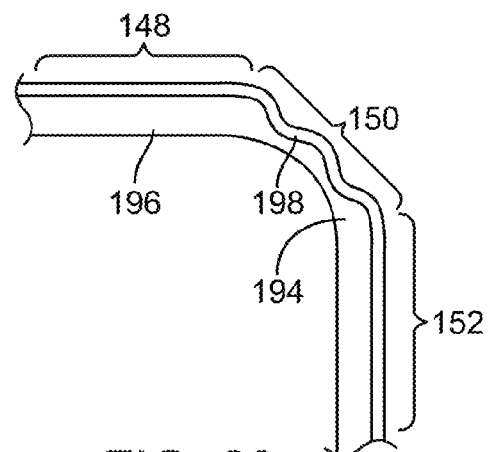
FIG. 23 is a cross-sectional side view of a conductive line with a corrugated shape of the type shown in FIG. 22 that is being used to form a signal path on a bent surface of a display layer such as a display pixel substrate or touch sensor substrate in accordance with an embodiment of the present invention.

Metal line 198 may be used in forming segment 150 and, if desired, some or all of segments 148 and 152. The vertically undulating surface of metal line 198 may be used in forming line segment 150. When the metal line is bent as shown in FIG. 23, the waviness of metal line 198 in segment 150 may allow line 198 to stretch when bent, thereby avoiding stress-induced cracking.

Figure 24:
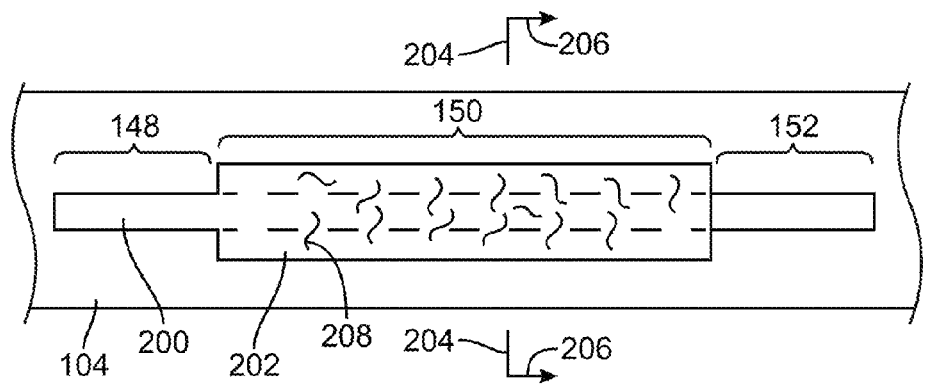
FIG. 24 is a top view of a conductive line with a corrugated shape of the type shown in FIG. 22 that is being used to form a signal path on a bent surface of a display layer such as a display pixel substrate or touch sensor substrate in accordance with an embodiment of the present invention.

FIG. 24 is a top view of a conductive display line (line 200) in a configuration in which conductive display line 200 has been provided with a conductive layer such as conductive layer 202 in line segment 150. Conductive layer 202 may be formed from a material that contains conductive particles such as metal paint, carbon nanotubes, gold nanotubes, other metal nanotubes, other conductive nanofibers, metal particles, or other conductive particles such as particles 208. The conductive particles of conductive layer 202 may be applied in a resin or solvent.

Conductive layer 202 may be patterned to form a rectangular patch that overlaps line 200 in line segment 150, a line that overlaps line 200 within line segment 150, or a patch of other shapes. Photolithographic patterning or other patterning techniques (e.g., pad printing, screen printing, ink-jet printing, etc.) may be used in forming conductive layer 202.

Figure 25:
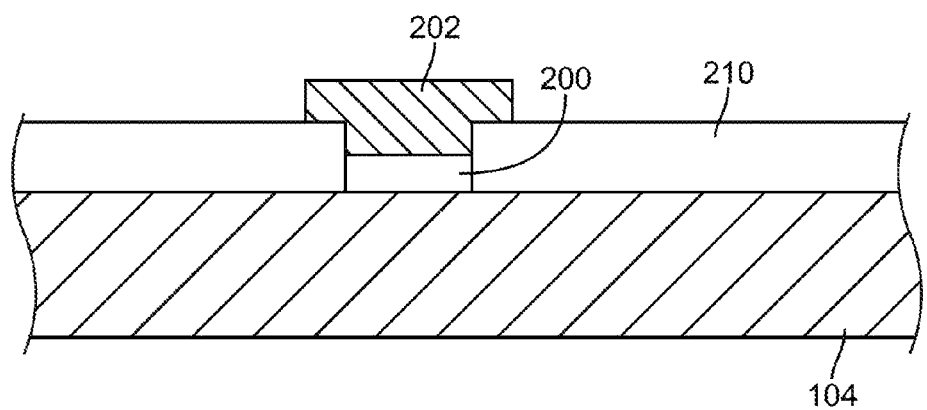
FIG. 25 is a cross-sectional end view of a conductive line with an additional conductive layer that is being used to form a signal path on a bent surface of a display layer such as a display pixel substrate or touch sensor substrate in accordance with an embodiment of the present invention.

FIG. 25 is a cross-sectional side view of line segment 150 of FIG. 24 taken along line 204 and viewed in direction 206. As shown in FIG. 25, conductive line 200 may be formed on flexible display layers 104 (e.g., layers including a dielectric layer on which conductive line 200 is formed). Dielectric layer 210 (e.g., a passivation layer such as one or more layers of silicon oxide and/or silicon nitride) may have an opening such as an elongated trench-shaped opening that overlaps line 200 within line segment 150. Conductive material 202 may be deposited within the trench in contact with line 200. Conductive material may be more resistant to damage and resistance increases when bent than unbent and uncovered portions of line 200, thereby enhancing the ability of the display line to flex in bent segment 150 without sustaining damage.

The foregoing illustrative configurations for forming display lines with structures and/or materials that allow the display lines to bend without damage and undesired increases in resistance within segments such as segments 150 may be used separately on in any combination. As an example, segment 150 may be implemented using parallel paths, single layer of conductive material, multiple layers of conductive material, lines with corrugated surfaces, lines with meandering paths, lines with locally soft metals, lines with locally widened metals, lines that have been formed using overlapping lines coupled with vias, lines that have been coated with conductive particles such as carbon nanotubes or metal nanotubes or metal particles associated with a metal paint, lines with mesh conductors, and/or lines that been coated with other conductive material.

The foregoing is merely illustrative of the principles of this invention and various modifications can be made by those skilled in the art without departing from the scope and spirit of the invention.

What is claimed is:

1. A display, comprising:
    a display layer having an active region and an inactive region, wherein the active region defines a plane, wherein the inactive region has a curved portion that curves out of the plane, and wherein the inactive region has a flat portion adjacent to the curved portion; and
    a conductive line on the display layer that extends from the active region to the curved portion and the flat portion of the inactive region, wherein the conductive line comprises a single segment in the inactive area that splits into first and second line segments on the curved portion and that joins back into a single segment on the flat portion.

2. The display defined in claim 1 wherein the first line segment is parallel to the second line segment.

3. The display defined in claim 1 wherein the first line segment has first and second portions and wherein the second portion is at a nonzero angle relative to the first portion.

4. The display defined in claim 3 wherein the second line segment has first and second portions and wherein the second portion is at a nonzero angle relative to the first portion.

5. The display defined in claim 4 wherein the second portion of the first line segment is parallel to the second portion of the second line segment.

6. The display defined in claim 1 wherein the conductive line comprises metal.

7. The display defined in claim 1 wherein the display layer comprises a flexible polymer substrate.

8. The display defined in claim 1 further comprising gate lines and data lines in the active region, wherein the first and second line segments form part of one of the gate lines.

9. The display defined in claim 8 further comprising gate driver circuitry in the peripheral border region.

10. The display defined in claim 9 wherein the first and second line segments are electrically coupled to the gate driver circuitry in the peripheral border region.

11. The display defined in claim 8 wherein the first and second line segments form part of one of the data lines.

12. The display defined in claim 1 further comprising organic light-emitting diode structures in the active region.

13. A display, comprising:
    a flexible polymer substrate having first and second flat portions joined by a curved portion;
    an array of display pixels on the first flat portion of the flexible polymer substrate;
    display circuitry on the second flat portion of the flexible polymer substrate; and
    conductive signal paths on the flexible polymer substrate that extend from the array of display pixels on the first flat portion to the display circuitry on the second flat portion, wherein at least one of the conductive signal paths comprises a single segment on the first flat portion that splits into multiple parallel line segments on the curved portion and that joins back into a single segment on the second flat portion.

14. The display defined in claim 13 wherein the multiple parallel line segments are electrically connected to one another.

15. The display defined in claim 13 wherein the display circuitry comprises thin-film-transistor gate driver circuitry.

16. The display defined in claim 13 wherein the display circuitry comprises demultiplexing circuitry.

17. A display, comprising:
    a flexible substrate having a central portion that defines a plane and an edge portion that curves out of the plane, wherein the central portion defines an active area of the display and the edge portion defines an inactive area of the display, and wherein the edge portion has a curved region and a flat region;

an array of display pixels on the central portion of the flexible substrate;

display circuitry on the edge portion of the flexible substrate; and conductive lines on the flexible substrate that convey signals from the display circuitry to the array of display pixels, wherein each of the conductive lines has a single segment in the active area that splits into a plurality of redundant signal paths on the curved region of the flexible substrate, wherein the plurality of redundant signal paths merge into a single segment on the flat region.

18. The display defined in claim 17 wherein the display circuitry comprises gate driver circuitry and the conductive lines comprise gate lines.

19. The display defined in claim 17 wherein the display circuitry comprises demultiplexing circuitry and the conductive lines comprise data lines.

* * * * *